United States Patent [19]

Hollinger

[11] Patent Number: 4,748,103
[45] Date of Patent: May 31, 1988

[54] MASK-SURROGATE SEMICONDUCTOR PROCESS EMPLOYING DOPANT PROTECTIVE REGION

[75] Inventor: Theodore G. Hollinger, Bend, Oreg.
[73] Assignee: Advanced Power Technology, Bend, Oreg.
[21] Appl. No.: 842,771
[22] Filed: Mar. 21, 1986
[51] Int. Cl.$^4$ ............................................. G03C 5/00
[52] U.S. Cl. .................... 430/314; 430/317; 430/945; 148/187; 437/28; 437/29; 437/36; 437/41; 437/147; 437/150; 437/157; 437/229; 437/907; 437/913; 437/931; 437/984
[58] Field of Search ............... 430/313, 317, 314, 945, 430/311; 250/492.21, 492.3; 148/187; 29/578; 437/28, 930, 29, 931, 34, 933, 36, 40, 41, 147, 150, 157, 229, 907, 913, 984, 986

[56] References Cited

U.S. PATENT DOCUMENTS

| | | | |
|---|---|---|---|
| 3,739,237 | 6/1973 | Shannon | 357/23.9 |
| 3,849,216 | 11/1974 | Salters | 148/187 |
| 3,863,330 | 2/1975 | Kraybill et al. | 29/571 |
| 4,015,278 | 3/1977 | Fukuta | 357/22 |
| 4,106,954 | 8/1978 | deBrebisson et al. | 148/1.5 |
| 4,231,811 | 11/1980 | Somekh et al. | 148/1.5 |
| 4,329,773 | 5/1982 | Geipel, Jr. et al. | 29/571 |
| 4,368,573 | 1/1983 | DeBrebisson | 29/569 R |
| 4,375,124 | 3/1983 | Cogan | 29/571 |
| 4,383,026 | 5/1983 | Hall | 430/325 |
| 4,414,059 | 11/1983 | Blum et al. | 156/659.1 |
| 4,419,811 | 12/1983 | Rice | 437/150 |
| 4,437,925 | 3/1984 | Cogan | 156/653 |
| 4,450,041 | 5/1984 | Aklufi | 156/628 |
| 4,459,605 | 7/1984 | Rice | 357/22 |
| 4,468,682 | 8/1984 | Cogan | 357/22 |
| 4,486,943 | 12/1984 | Ryden et al. | 29/571 |
| 4,497,107 | 2/1985 | Cogan | 29/571 |
| 4,503,598 | 3/1985 | Vora et al. | 437/41 |
| 4,503,599 | 3/1985 | Ueyanagi et al. | 29/571 |
| 4,543,706 | 10/1985 | Bencuya et al. | 29/571 |
| 4,545,113 | 10/1985 | Vora | 29/578 |
| 4,553,316 | 11/1985 | Houston et al. | 29/571 |
| 4,558,508 | 12/1985 | Kinney et al. | 29/571 |
| 4,561,168 | 12/1985 | Pitzer et al. | 29/571 |
| 4,566,172 | 1/1986 | Bencuya et al. | 29/571 |
| 4,573,257 | 3/1986 | Hulseweh | 29/576 E |
| 4,586,243 | 5/1986 | Weaver et al. | 29/578 |
| 4,615,103 | 10/1986 | Kameyama et al. | 29/576 W |

FOREIGN PATENT DOCUMENTS

2055247 2/1981 United Kingdom ................ 437/36

*Primary Examiner*—John E. Kittle
*Assistant Examiner*—José G. Dees
*Attorney, Agent, or Firm*—Kolisch, Hartwell & Dickinson

[57] ABSTRACT

A mask-defect-immune process for making MOS semiconductor devices. The process features the creation of a surrogate mask in semiconductor wafer material per se, thus to eliminate the requirement that plural masks be used, and that plural mask alignments be performed. In all ways of practicing the invention, a surrogate mask is created in a dopant protective region.

11 Claims, 9 Drawing Sheets

MASK-SURROGATE SEMICONDUCTOR PROCESS EMPLOYING DOPANT PROTECTIVE REGION

BACKGROUND AND SUMMARY OF THE INVENTION

This invention relates to a method for producing MOS semiconductor devices, and more particularly, to such a method which substantially completely eliminates the incidence of fatal defects in a device as a consequence of defects in, and/or misalignment between, the usual several photolithography masks which heretofore have been used in the production of such devices.

For the purpose of illustration herein, a preferred manner of practicing the invention is described in the context of making field-effect, power-MOS transistors, in the manufacture of which the invention has been found to have particular utility. Application of the invention to the making of other specific MOS semiconductor devices, of course, will be immediately apparent to those skilled in the art.

In the prior art fabrication, on silicon wafers, of transistor devices, such as field-effect, power-MOS transistors, there has been a significant problem in (1) obtaining an acceptably high yield of relatively large-current-capability transistors without (2) driving the cost of production to extremely high and unacceptable levels. A major contributor to this problem in the past has been that the best known prior art fabrication techniques typically employ five or more independent masking, diffusion and metallization steps, with each offering a significant opportunity for the creation of a fatal error in a device. Generally speaking, the more the number of such steps, the greater the possibility for the occurrence of catastrophic defects.

These defects come about primarily because of misalignment occurring during the successive masking steps, and also in situations where one or more of the masks may, individually, have localized defects. Also, there is a possibility of fatal defects occurring as a result of airborne contaminants that may collect on a mask or a wafer, and this possibility, of course, is also aggravated by the plurality of masking steps now required.

As a consequence of this problem, it has not been economically feasible, with any expectation of achieving an acceptably high yield, to manufacture relatively large, high-current-capability devices. Put another way, the larger the design of the device, the greater is the likelihood that it will contain a fatal defect. To date, an economically practical size limit has been about 0.25-inches on each side of a device. Accordingly, the tendency in the past has been to reduce the size of individual devices so that the chance of a larger number of smaller devices surviving defects increases. However, these smaller devices, while emerging with an acceptable yield percentage, are capable only of handling relatively low-level currents, and thus low-power applications. Accordingly, they must be linked electrically in collections in some fashion in order to be able to handle relatively high-power applications.

Efforts in the past to improve the yield of larger-surface-area devices has taken place primarily through directing attention to several matters, key among which are performing the manufacturing steps in the cleanest possible environment, creating masks under extremely expensive manufacturing conditions, and handling mask alignment through very sophisticated, precise alignment machines. These areas of attention are extremely expensive, and, as a practical matter, make their use economically unattractive vis-a-vis the final market price which, as a consequence, must be attached to a finished device.

A general object of the present invention, therefore, is to provide a novel manufacturing procedure which is capable of reducing, substantially to zero, the percentage likelihood that a fatal defect will occur in a final MOS semiconductor device, even though that device may occupy the entire usuable area (i.e. as a single device) on a substrate, such as a silicon wafer.

A related object, accordingly, is to provide such a procedure which offers a simple and very low-cost process enabling the production of high-yield, defect-free MOS semiconductor devices which are capable, as individuals, of handling strikingly larger currents than are now practically handleable.

The key to the simplicity, effectiveness and cost advantage of the invention is that, according to one manner of practicing it, only a single, independent mask is required in the production of the usual plural, functional regions in a semiconductor device, and according to another way of practicing the invention, no mask at all is required. The invention, importantly, through the use of a dopant protective layer which protects an initially established MOS oxide layer, and layer which ultimately disappears, offers excellent and simply effected, control over the doping steps used to create the necessary operative junctions. These statements, essentially, summarize the heart of the invention, whose other objects and advantages will become more fully apparent as the description which now follows is read in conjunction with the drawings.

DETAILED DESCRIPTION OF THE INVENTION

Figure 1:
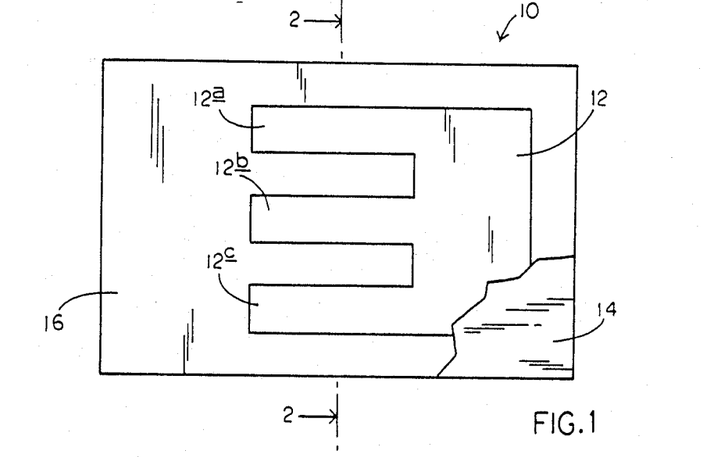
FIG. 1 is a simplified plan view, with a small portion broken away, illustrating a field-effect, power-MOS transistor (semiconductor device) which has been manufactured in accordance with the steps of the present invention.
Figure 2:
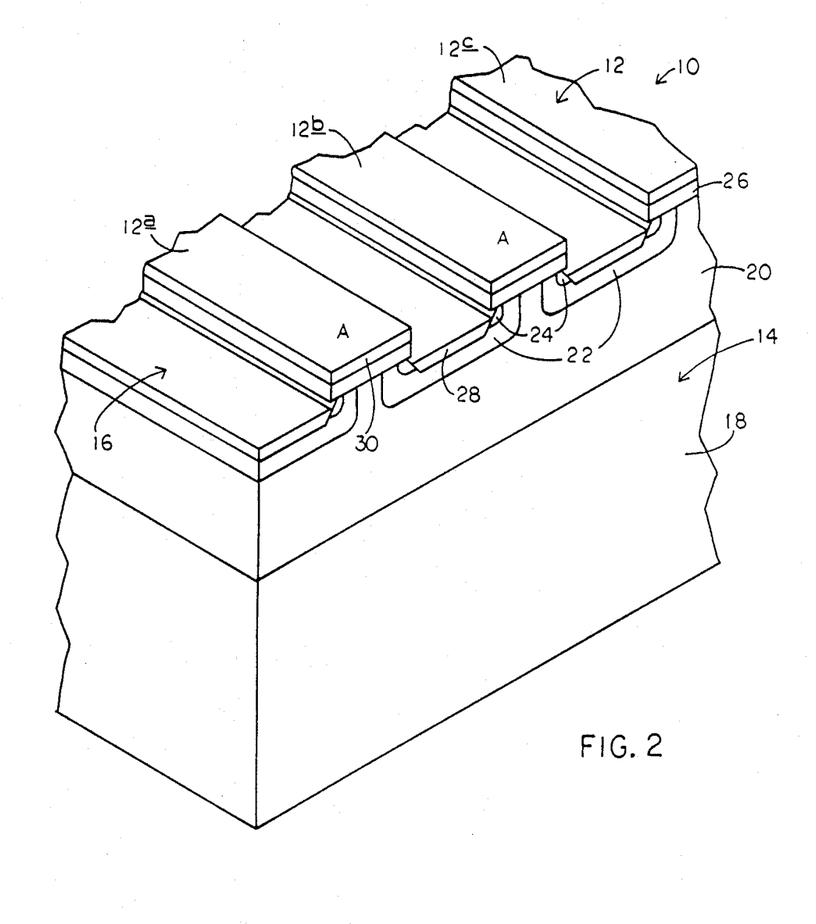
FIG. 2 is an enlarged, fragmentary, perspective view illustrating a section of the device of FIG. 1 taken generally along the line 2—2 in FIG. 1.

Turning now to the drawings, and directing attention first of all to FIGS. 1 and 2, indicated generally at 10 is an N-channel, field-effect, power-MOS transistor (MOS semiconductor device) which has been manufactured according to one manner of practicing the steps of the present invention. Transistor 10 is typical in construction to like prior art devices, and includes a gate 12, a drain 14 and a source 16. In the particular transistor embodiment shown in these two figures, gate 12 includes three "fingers" 12a, 12b, 12c.

In the description which now immediately follows, certain dimensions are given. These dimensions are specific to a transistor designed to act as a 500-volt switch.

Looking particularly at FIG. 2 for a moment, one can clearly see the various layers and functional regions which make up transistor 10. More specifically, in drain 14 there is a base N+ doped layer 18, and an N− doped epitaxial layer 20. Also included in the structure of transistor 10 is a P− doped layer 22 which forms the so-called "body" in the transistor, and residing therein an N+ doped layer 24 which forms the source in the transistor.

Residing immediately above the last-mentioned three layers is a gate-oxide layer ($SiO_2$) 26, also referred to as an MOS oxide layer, and two metallization layers 28, 30. These two metal layers are typically formed, and herein are formed, of aluminum. Layer 28 acts as an electrical contact for the source, and layer 30 forms previously mentioned gate 12.

With attention now drawn to FIGS. 3–16, inclusive, let us consider how transistor 10 was formed in accordance with one manner of practicing the invention.

Figure 3:
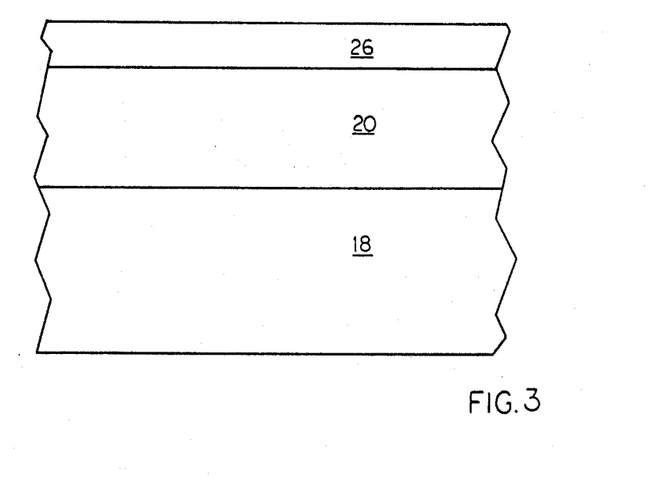
FIGS. 3-16, inclusive, are enlarged, fragmentary views, taken generally in the area bracketed by the letters A—A in FIG. 2, illustrating successive steps according to one manner of practicing the invention.

Layers 18, 20 reside in the usual commercially available silicon wafer, and may be thought of herein as forming the "starting material" for the manufacture of transistor 10. In the particular structure now being described, layer 18 has a thickness of about 15-mils and a resistivity of about 0.007–0.02-ohm-centimeters. Epitaxial layer 20 has a thickness herein of about 36–44-microns, and a resistivity of about 16–22-ohm-centimeters. Gate-oxide layer 26 has a thickness herein of about 2400-Angstroms, and is conventionally thermally grown, as an initial processing procedure, through oxidation in a diffusion furnace at a temperature of around 1100° C. Layers 18, 20, 26 herein make up what is referred to as a substrate structure. Layer 26 is referred to as an outer layer.

Figure 4:
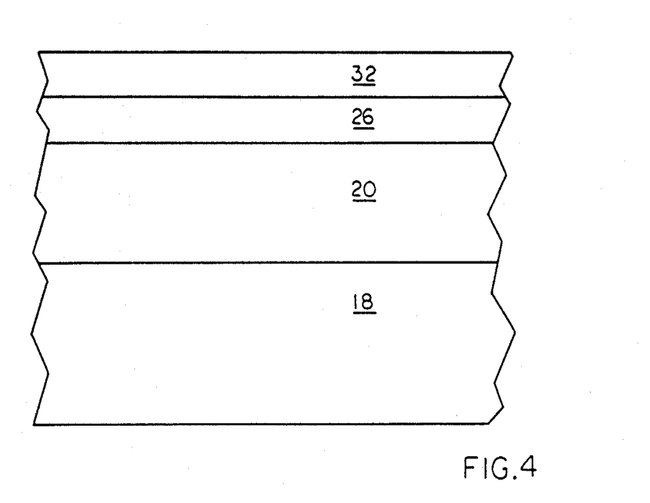
Figure 5:
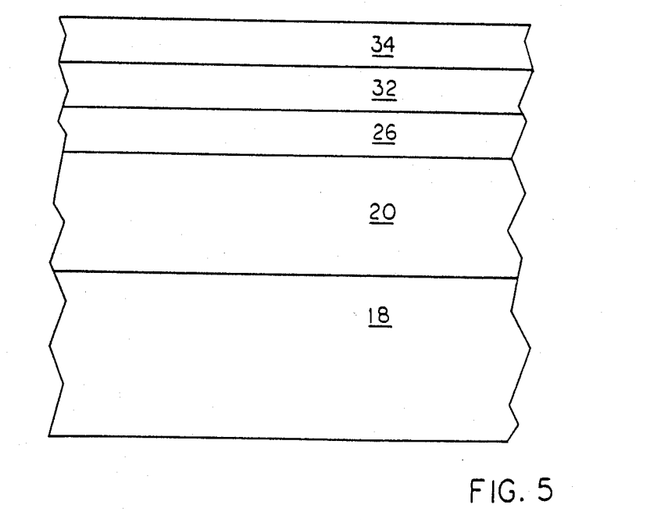

FIG. 4 illustrates the preparation of a new layer 32 which overlies layer 26. Layer 32 herein, also referred to as a dopant protective layer, takes the form of polysilicon, which is prepared or formed through conventional chemical vapor deposition to have a thickness of roughly 7000-Angstroms. This layer, which ultimately disappears, as will be explained, plays a significant role both in avoiding multiple masking steps, and in controlling proper doping to create the desired junctions. There are several considerations which relate to the selection of the material to be used for layer 32. More specifically, the material in this layer must be etchable in a medium which is different than that in which layer 26 is etchable. Further, layer 32 must be capable of withstanding (i.e., retaining structural integrity) at the high temperatures which characterize conventional diffusion steps. Finally, layer 32, in order to protect the MOS oxide layer (26), must be impenetrable (100% penetration) to the doping substances which are used to form previously mentioned layers 22, 24. Particular materials other than polysilicon which may be used for this layer include silicon nitride, refractory-metal silicide, and doped oxides.

Prepared by any conventional pinhole-free technique as a layer 34 over layer 32 (see FIG. 5) is a negative photoresist. A positive photoresist could also be used to form this layer.

According to the manner of practicing the invention which is now being described, only a single masking step, involving a single, independent mask, is required. This is a key factor minimizing the likelihood that any fatal defect will occur during subsequent processing steps. Put another way, and as will become apparent, any such defect which could possibly result in subsequent steps will result, with very few exceptions, from the existence of an internal defect in the mask used per se. If such a defect turns up, a new defect-free mask can easily be prepared.

Figure 6:
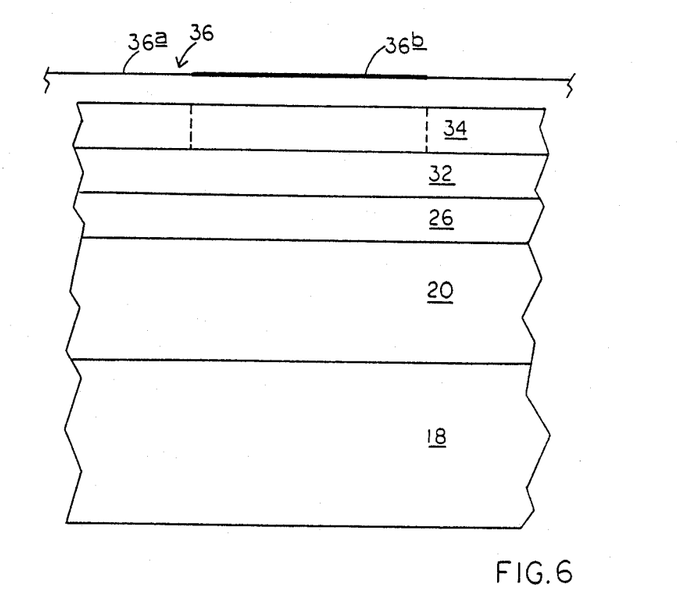

So, turning attention briefly to FIG. 6, the single, independent mask which is employed herein during the photolithography steps is shown generally at 36. As will be well understood by those skilled in the art, the pattern which will ultimately result in transistor 10 is suitably created in mask 36, and in FIG. 6, mask 36 can be seen to include light-transparent areas, such as area 36a, and light-opaque areas, such as area 36b.

The assembly illustrated in FIG. 6 is exposed to light during a typical photolithography step, and as a consequence, the photoresist layer ends up with regions exposed (outside the dashed lines) and regions not exposed (inside the dashed lines) to light.

Figure 7:
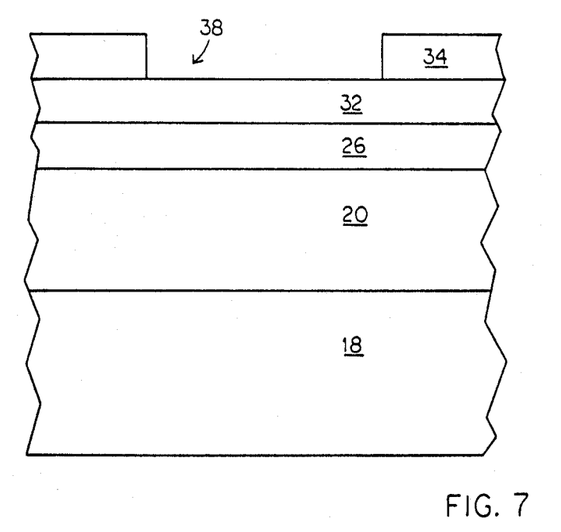

FIG. 7 illustrates the next step, wherein photoresist, and specifically those regions which have not been exposed to light, is removed conventionally by a suitable photoresist developer. Such a removed region is shown generally at 38.

Figure 8:
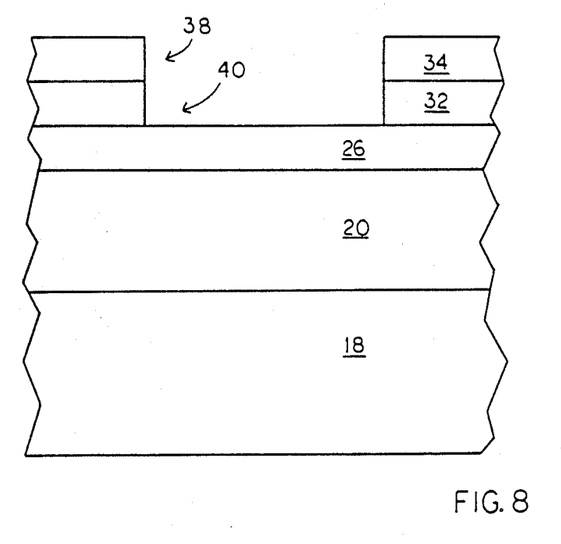

FIG. 8 illustrates the next step, wherein the polysilicon layer is now etched, by any commercial etching technique, to transfer the image previously created in photoresist layer 34 into layer 32. Accordingly, a matching image for region 38 is created in layer 32, and such is indicated generally as a region at 40. Region 40 is referred to herein as a mask-surrogate pattern-definer. The term "mask-surrogate pattern-definer" is used to point out an important operational feature of the invention, namely that through the creation of such a pattern-definer in the structure itself, one completely eliminates the need for the use of any independent mask other than mask 36. Obviously, this is an important contribution to the creation of a device free from masking-related defects, in that, such a defect can no longer develop in the structure through the subsequent processing steps.

The pattern-definer thus formed has a defined outline (edge configuration). As will become apparent in the description which continues, this outline per se, with no alteration, is used as the only necessary self-alignment masking agency in manufacturing steps that follow.

Figure 9:
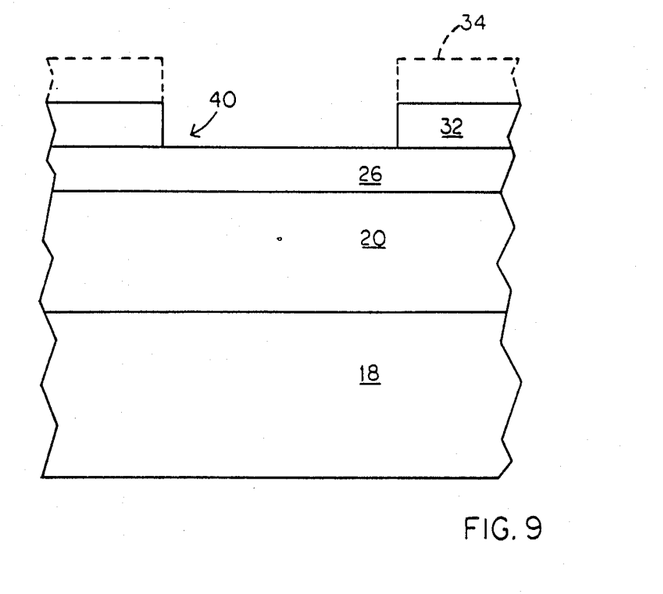

Photoresist layer 34 is now removed by any convenient conventional technique, and this is illustrated in FIG. 9.

The process now continues into what are referred to generally herein as doping steps.

Figure 10:
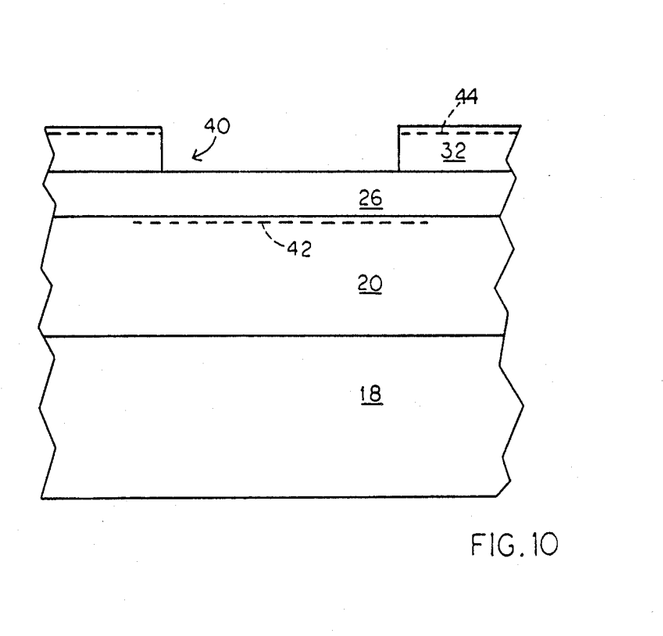

FIG. 10 illustrates a first implant step, which takes the form of a boron implant that will result, as will be explained, in previously mentioned layer 22. The boron implant step is performed in a conventional implanter at an energy level of about 160-KEV to produce an implant density in layer 20 of about $6 \times 10^{13}$-atoms-per-cubic-centimeter. Dashed line 42 illustrates the material implanted in layer 20 by this step, and this implant extends to a depth in layer 20 of about 0.27-microns. As can be seen, dashed line 42 extends laterally beyond the boundaries of pattern-definer 40, and this results from the action of the gate-oxide layer which functions as a dispersion medium.

A dashed line shown at 44 illustrates that there is some penetration of boron into layer 32, but not a complete penetration of this layer. Layer 32's opaqueness to boron penetration functions, importantly, to achieve properly controlled doping in this step.

While boron has been described herein as the first implant substance, others which could be used to perform, ultimately, the same function, include bismuth and aluminum.

Figure 11:
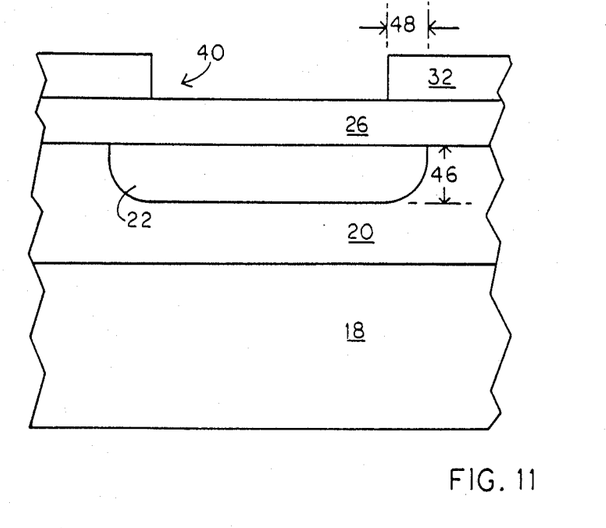

FIG. 11 illustrates the first diffusion step, which is performed in a conventional diffusion furnace at a typical temperature of about 1150° C. for about 3–8-hours. Here, as can be seen, what results is the beginning of previously described layer 22. Typically, this diffused region has a depth, shown at 46 in FIG. 11, of about 3–6-microns. This region extends laterally beyond the margins of pattern-definer 40 by a dimension, shown generally at 48, which is about 60–80% of dimension 46.

Figure 12:
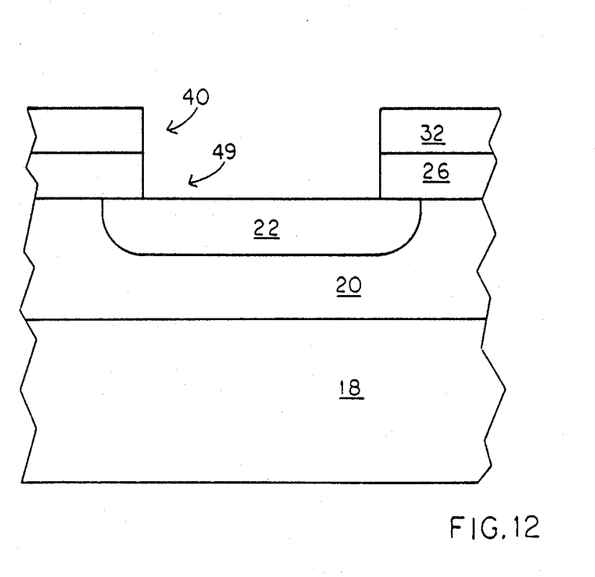

FIG. 12 illustrates the next step in the procedure, wherein layer 26 is etched by any commercial etching technique to transfer into layer 26 a matching pattern (image of first pattern-definer 40). Thus, as is illustrated generally at 49, there results a region in layer 26 which matches (in outline) region 40.

Figure 13:
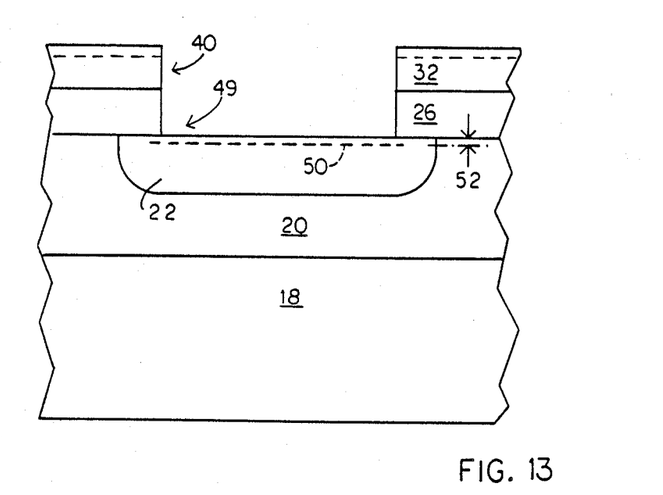

FIG. 13 illustrates a second implant step which is performed herein using phosphorous. This step, as was true of the first implant step, takes place in a conventional implanter at an energy level of about 160-KEV to produce a final implant density of about $5 \times 10^{15}$ to $1 \times 10^{16}$-atoms-per-cubic-centimeter. The implant which results in layer 20 is indicated by dashed line 50, and this extends to a depth, indicated at 52, of about 0.2-microns. It should be noted that, as is indicated by dashed line 50, the implant just performed is contained completely within diffused region 22, and extends laterally slightly beyond the boundaries of pattern-definer 40. The upper dashed line slight penetration of phosphorous into layer 32, but nowhere complete penetration. Thus, here too, dopant opaqueness in layer 32 functions significantly, as mentioned in connection with the boron doping implant step, to control and effect a proper final doped result.

While phosphorous has been used specifically herein to perform this implant, other materials which could be used include arsenic and antimony.

Figure 14:
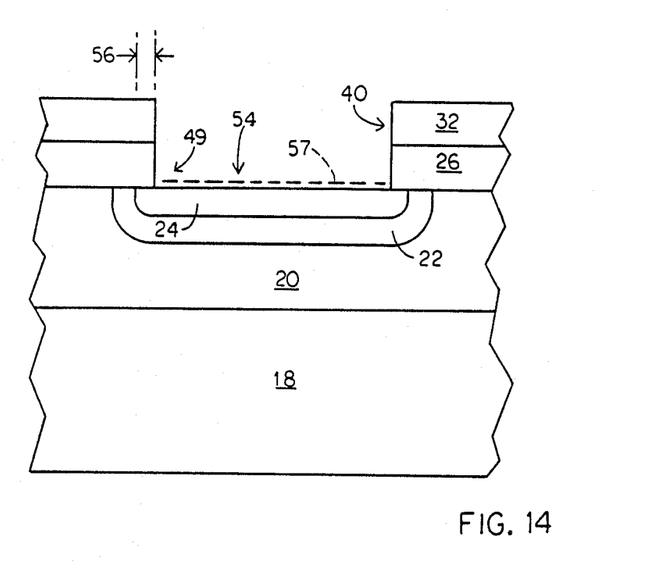

FIG. 14 illustrates the second and final diffusion step which is conducted to create transistor 10. This diffusion also takes place in a diffusion furnace, typically at a temperature of about 1100° C. for about 1–3-hours. What results, completely within the region indicated at 22, is a new diffused region which will result ultimately in previously described source layer 24. Layer 24 has a depth dimension, of about 1–3-microns, and a lateral-extension dimension, shown at 56, (extending beyond the boundaries of pattern-definer 40) which is about 60–80% of the depth.

A consequence of this second diffusion step is the growth in region 49 of a thin oxide film 57 on the surface of layer 20. At this point in the procedure, this oxide is removed by any suitable conventional etching technique.

Figure 15:
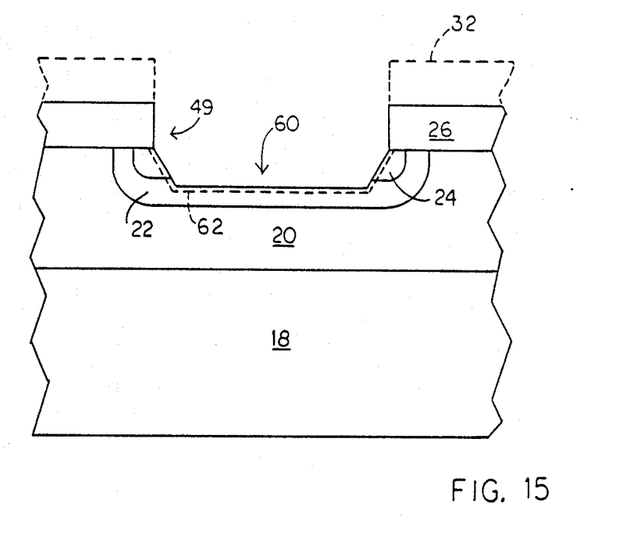

FIG. 15 illustrates a subsequent step in which silicon in the upper portion of layer 20 is etched to produce the trench shown generally at 60. In transistor 10, the silicon in the wafer mentioned earlier has a crystal orientation herein of <100>. The etch just referred to is performed anisotropically using potassium hydroxide. Preferably, the potassium hydroxide etch just mentioned is followed by an isotropic, planar etch using a mixture of nitric, acetic and hydrofluoric acids to remove any trace of remaining potassium, and to enlarge the trench slightly by what might be thought of as a removed wall thickness of about 0.25–0.5-microns, thus to create an overhang for the underside of layer 26. This is illustrated by dashed line 62 in FIG. 15.

It is important that these etches be controlled to assure that trench 60 extends completely through the second-described diffusion region 24, but not completely through the first-described diffusion region 22. It is also important that the etching thus performed create a sufficiently upright wall in trench 60 which will positively assure electrical separation, during a later processing step, of the metallization in previously described layers 28, 30.

FIG. 15 also demonstrates yet another consequence of the planar etch—namely the removal of layer 32.

Figure 16:
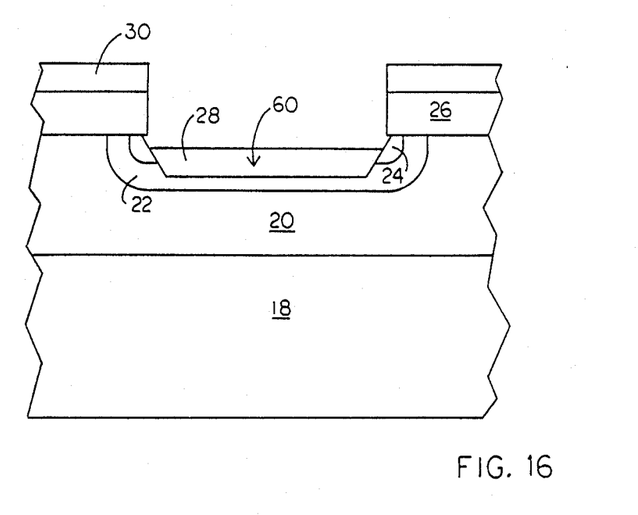

FIG. 16 illustrates a final step in the manner now being described of practicing the invention. The step herein illustrated is the so-called metallization, or conductive-material-deposition, step where aluminum is preferably cold-evaporated to create source layer 28 and gate layer 30. It is important that this step be conducted in such a manner that metal which forms layer 28 contact layer 24, but not contact layer 30. The isotropic etch described previously relative to FIG. 15, in conjunction with employing cold-evaporation for creating the metallization layers, helps to assure non-contact between layers 28, 30.

With completion of the metallization step, the basic formation of transistor 10 is complete.

It should be obvious now to those skilled in the art that, according to this manner of practicing the invention, the use of a single, independent mask to create a defined-outline mask-surrogate pattern-definer in the structure itself, substantially eliminates the possibility of a fatal defect occurring. Another way of looking at this is that once the independent masking step is performed, all of the other critical steps—the two diffusions, the etching and the metallization—become "self-aligning". This is a key contribution of the invention.

Figure 17:
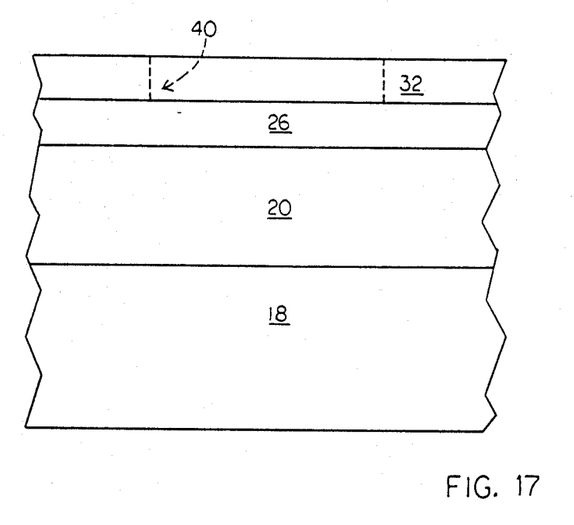
FIG. 17 is a view, similar to the last-described views, which illustrates an alternative manner of practicing the invention.

As was mentioned earlier, there is yet another significant manner of practicing the invention. This is illustrated generally in FIG. 17. As an aid to understanding what is shown in FIG. 17, this figure should be related to previously described FIG. 9.

This alternative manner of practicing the invention is one wherein no independent mask is used. Rather, under computer control, what has been referred to earlier as mask-surrogate pattern-definer 40 is removal-formed directly in layer 32, either by laser-beam impingement, or by ion-beam bombardment. Also, instead of using such a technique to remove material in the formation of a mask-surrogate pattern-definer, the same technique could be employed to deposit such a pattern-definer. Thereafter, all of the other steps described earlier are performed in the same respective manners.

Accordingly, one should now see how the method proposed by the invention offers a dramatic improvement over the best-known prior art procedures. Bluntly stated, mask-dependent, catastrophic errors or defects in a finally produced semiconductor device are completely obviated. Doping is precisely and effectively controlled. As a significant consequence, the entire usable area of a silicon wafer can be employed with assurance, even in the manufacture of a single, extremely large device, that it will be free from a mask-dependent failure.

In addition to the obvious advantages discussed above which result from employment of the method of the present invention, there are certain others which are worth noting. Obviously, by minimizing, in one case to zero, the number of masking steps required, manufacturing time and the number of required manufacturing personnel are reduced. Also, less expensive processing equipment can be used than is now required. Additionally, by shrinking the overall processing time, this reduces the work-in-process inventory, and, of course, such is an important expense consideration. A point to note in this connection is that, through employing the technique of the invention in the computer-controlled laser/ion beam applications, one can design and generate a semiconductor device easily in an extremely short period of time—even as short as a single day.

Yet another advantage offered by the invention is that it eliminates the kind of defects which can result from temperature and humidity changes that occur in the working environment over the time now required to complete multiple masking steps. The mask-surrogate pattern-definer which is created, and built into the structure, eliminates these possibilities.

Thus, one should see how the important objects of the invention, and the advantages claimed for it, are readily obtained.

While alternate manners of practicing the invention have been described herein, it is understood that variations and modifications are possible without departing from the spirit of the invention.

It is claimed and desired to secure by Letters Patent:

1. A method employing no more than one independent mask of producing a plural-functional-region MOS semiconductor device in a substrate structure including an outer, MOS oxide layer, and wherein at least one doping step is involved, said method comprising
    forming over the oxide layer a dopant protective layer,
    creating a first and only mask-surrogate pattern-definer having a defined outline characteristic in such protective layer, and
    thereafter, employing the unaltered perimetral outline characteristic per se of such only-created pattern-definer for control and self-alignment masking to effect the making of the desired, final functional regions in the device, including a conductive-material deposition step.

2. The method of claim 1, wherein said creating is accomplished in the absence of the use of any independent mask.

3. The method of claim 2, wherein said creating is performed by a controlled laser.

4. The method of claim 2, wherein said creating takes place through ion-beam bombardment.

5. The method of claims 1, 2, 3 or 4, wherein the making of the final functional regions includes at least one diffusion step.

6. A method of producing a plural-functional-region MOS semiconductor device in a substrate structure including an outer, MOS oxide layer, said method comprising
    forming over the oxide layer a dopant protective layer,
    in the absence of the use of any independent mask, creating a first and only mask-surrogate pattern-definer having a defined outline characteristic in such protective layer, and
    thereafter, employing the unaltered perimetral outline characteristic per se of such only-created pattern-definer for control and self-alignment masking to effect the making of the desired, final functional regions in the device, including a conductive-material deposition step.

7. The method of claim 6, wherein said creating is performed by a controlled laser.

8. The method of claim 6, wherein said creating takes place through ion-beam bombardment.

9. The method of claims 6, 7 or 8, wherein the making of the final functional regions includes at least one doping step.

10. A method of producing a plural-functional-region MOS semiconductor device in a substrate structure including an outer MOS oxide layer, and wherein at least one doping step is involved, said method comprising
    forming over the oxide layer a dopant protective layer,
    creating, with a single, pre-configured, independent mask, a first and only mask-surrogate pattern-definer having a defined outline characteristic in such protective layer, and
    thereafter, employing the unaltered perimetral outline characteristic per se of such only-created pattern-definer, in lieu of any other independent mask, for control and self-alignment masking to effect the making of the desired, final functional regions in the device.

11. The method of claim 1, wherein the making of the final functional regions includes at least one diffusion step.

* * * * *

UNITED STATES PATENT AND TRADEMARK OFFICE
CERTIFICATE OF CORRECTION

PATENT NO. : 4,748,103

DATED : May 31, 1988

INVENTOR(S) : Theodore G. Hollinger

It is certified that error appears in the above-identified patent and that said Letters Patent is hereby corrected as shown below:

In claim 11, line 1, replace "1" with --10--.

Signed and Sealed this

First Day of August, 1989

Attest:

DONALD J. QUIGG

*Attesting Officer*　　　*Commissioner of Patents and Trademarks*